United States Patent
Lehman, Jr. et al.

(10) Patent No.: US 8,009,442 B2
(45) Date of Patent: Aug. 30, 2011

(54) DIRECTING THE FLOW OF UNDERFILL MATERIALS USING MAGNETIC PARTICLES

(75) Inventors: Stephen E. Lehman, Jr., Chandler, AZ (US); Rahul N. Manepalli, Chandler, AZ (US); Leonel R. Arana, Phoenix, AZ (US); Wendy Chan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/966,940

(22) Filed: Dec. 28, 2007

(65) Prior Publication Data

US 2009/0168390 A1 Jul. 2, 2009

(51) Int. Cl.
*H05K 7/00* (2006.01)

(52) U.S. Cl. .......... 361/820; 361/305; 29/832; 438/106; 438/120; 438/612; 257/728; 257/787

(58) Field of Classification Search ................. 361/820, 361/305; 29/832; 438/612, 106, 120; 257/728, 257/787
See application file for complete search history.

(56) References Cited

U.S. PATENT DOCUMENTS

| | | | | | |
|---|---|---|---|---|---|
| 3,863,249 | A | * | 1/1975 | Olah | 340/815.44 |
| 5,660,481 | A | * | 8/1997 | Ide | 384/122 |
| 6,277,298 | B1 | * | 8/2001 | Borduz et al. | 252/62.52 |
| 6,333,206 | B1 | * | 12/2001 | Ito et al. | 438/106 |
| 6,406,988 | B1 | * | 6/2002 | Chung | 438/612 |
| 6,415,821 | B2 | * | 7/2002 | Kamholz et al. | 137/827 |
| 6,620,512 | B2 | | 9/2003 | Jayaraman et al. | 428/414 |
| 6,716,629 | B2 | * | 4/2004 | Hess et al. | 435/420 |
| 6,916,687 | B2 | * | 7/2005 | Ho et al. | 438/120 |
| 7,109,061 | B2 | * | 9/2006 | Crane et al. | 438/118 |
| 7,144,299 | B2 | | 12/2006 | Arana et al. | 451/28 |
| 7,217,600 | B2 | | 5/2007 | Lehman, Jr. | 438/127 |
| 7,224,050 | B2 | | 5/2007 | Matayabas, Jr. et al. | 257/678 |
| 7,314,778 | B2 | | 1/2008 | Jayaraman et al. | 438/106 |
| 7,323,360 | B2 | * | 1/2008 | Gonzalez et al. | 438/108 |
| 7,332,822 | B2 | * | 2/2008 | Basheer et al. | 257/787 |
| 7,351,784 | B2 | | 4/2008 | Lehman, Jr. | 528/122 |
| 7,434,915 | B2 | * | 10/2008 | Silverbrook | 347/54 |
| 7,534,649 | B2 | | 5/2009 | Lehman, Jr. et al. | 438/106 |
| 7,547,579 | B1 | * | 6/2009 | Jiang | 438/118 |
| 7,579,046 | B2 | | 8/2009 | Lehman, Jr. et al. | 427/301 |
| 2002/0033540 | A1 | * | 3/2002 | Akram et al. | 257/778 |
| 2003/0183954 | A1 | * | 10/2003 | Wolf | 257/795 |
| 2004/0033643 | A1 | * | 2/2004 | Odegard et al. | 438/120 |
| 2004/0115340 | A1 | * | 6/2004 | Griego | 427/98 |

(Continued)

OTHER PUBLICATIONS

Shen et al., "Structure of Alkanoic Acid Stabilized Magnetic Fluids, A Small-Angle Neutron and Light Scattering Analysis", Langmuir, vol. 17, No. 2, (2001), pp. 288-299.

(Continued)

*Primary Examiner* — Xiaoliang Chen
(74) *Attorney, Agent, or Firm* — Konrad Raynes & Victor LLP; Alan S. Raynes

(57) ABSTRACT

Electronic devices and methods for fabricating electronic devices are described. One method includes providing a substrate and a die, and coupling the die to the substrate, wherein a gap remains between the die and the substrate. The method also includes placing an underfill material on the substrate and delivering at least part of the underfill material into the gap. The method also includes controlling the flow of the underfill material in the gap using magnetic force. Other embodiments are described and claimed.

15 Claims, 4 Drawing Sheets

U.S. PATENT DOCUMENTS

| | | | |
|---|---|---|---|
| 2005/0016658 A1* | 1/2005 | Asokan et al. | 156/53 |
| 2006/0068579 A1* | 3/2006 | Suh et al. | 438/612 |
| 2006/0073624 A1 | 4/2006 | Manepalli et al. | 438/26 |
| 2007/0152311 A1 | 7/2007 | Jayaraman et al. | 257/678 |
| 2007/0170533 A1* | 7/2007 | Doogue et al. | 257/422 |
| 2008/0042266 A1* | 2/2008 | Kagaya et al. | 257/724 |
| 2008/0122047 A1* | 5/2008 | Honer et al. | 257/660 |
| 2008/0150170 A1 | 6/2008 | Manepalli et al. | 257/795 |
| 2008/0157862 A1* | 7/2008 | Hatanaka et al. | 327/551 |
| 2008/0170936 A1* | 7/2008 | Den Toonder et al. | 415/140 |
| 2008/0237842 A1 | 10/2008 | Manepalli | 257/712 |
| 2008/0238587 A1* | 10/2008 | Shin et al. | 333/28 R |
| 2008/0239620 A1* | 10/2008 | Min et al. | 361/305 |
| 2008/0251904 A1 | 10/2008 | Theuss et al. | 257/679 |
| 2008/0265367 A1* | 10/2008 | Tan et al. | 257/531 |
| 2008/0277781 A1* | 11/2008 | Sun et al. | 257/723 |
| 2009/0004317 A1 | 1/2009 | Hu et al. | 425/352 |
| 2009/0170247 A1 | 7/2009 | Shekhawat et al. | 438/127 |

OTHER PUBLICATIONS

Shen et al., "Bilayer Surfactant Stabilized Magnetic Fluids: Synthesis and Interactions at Interfaces", Langmuir, vol. 15, No. 2, (1999), pp. 447-453.

Berkowitz et al., "Properties of Magnetic Fluid Particles", IEEE Transactions on Magnetics, vol. Mag-16, No. 2 (Mar. 1980), pp. 184-190.

Raj. et al., "Commercial Applications of Ferrofluids", J. Magn. Magn. Mater. vol. 85, (1990), pp. 233-245.

Rosensweig, R.E. Ferrohydrodynamics, Cambridge University Pres: Cambridge (1985), pp. 33-73, 119-123, 177-199, 272-314.

Berkovsky, B.M. et al. Magnetic Fluids Engineering Applications, Oxford University Press: Oxford (1993), pp. 1-35, 60-65, 94-126.

Pieters, B. R., et al. "Magnetic carrier technology", Ch. 8 in Colloid and Surface Engineering Applications in the Process Industries. Ed. by R.A. Williams, Butterworth-Heinemann Ltd: Oxford, (1992), pp. 248-286.

Sonvico et al., "Folate-Conjugated Iron Oxide Nanoparticles for Solid Tumor Targeting as Potential Specific Magnetic Hyperthermia Mediators: Synthesis, Physicochemical Characterization, and in Vitro Experiments", *Bioconjugate Chem.* (2005), 1181-1188.

Pankhurst et al., "Applications of magnetic nanoparticles in biomedicine", *J.Phys. D: Appl. Phys.* 36(2003) R167-R181.

Gangopadhyay et al., "Novel Superparamagnetic Core(Shell) Nanoparticles for Magnetic Targeted Drug Delivery and Hyperthermia Treatment", *IEEE Transactions on Magnetics*, vol. 41, No. 10, (Oct. 2005), 4194-4196.

Tanaka et al., "Novel Superparamagnetic Core(Shell) Nanoparticles for Magnetic Targeted Drug Delivery and Hyperthermia Treatment", *J. Bioscience and Bioengineering*, vol. 100, No. 1, (2005), 112-115.

Hergt et al., "Magnetic particle hyperthermia: nanoparticle magnetism and materials development for cancer therapy" *J. Phys.: Condens. Matter* 18 (2006) S2919-S2934.

Jordan et al., "Magnetic fluid hyperthermia (MFH): Cancer treatment with AC magnetic field induced excitation of biocompatible superparamagnetic nanoparticles", *Journal of Magnetism and Magnetic Materials* 201 (1999) 413-419.

Jordan et al., "The effect of thermotherapy using magnetic nanoparticles on rat malignant alioma", *Journal of Nemo-Oncology* (2006) 78: 7-14.

Mohr et. al., "Initiation of shape-memory effect by inductive heating of magnetic nanoparticles in thermoplastic polymers", *PNAS* vol. 103 No. 10 (Mar. 7, 2006) 3540-3545, published online Feb. 28, 2006 at www.pnas.org_cgi_doi_10.1073_pnas.0600079103.

Mohite, thesis entitled "Self Controlled Magnetic Hypothermia" Department of Mechanical Engineering, Florida State University College of Engineering (2004).

* cited by examiner

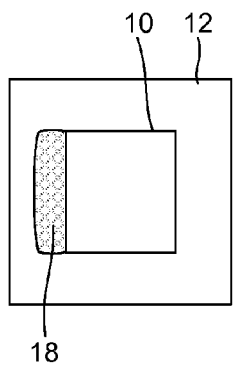 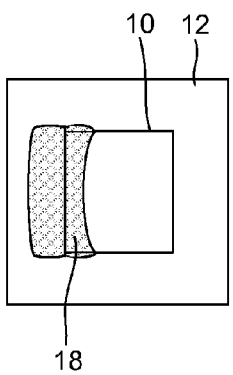 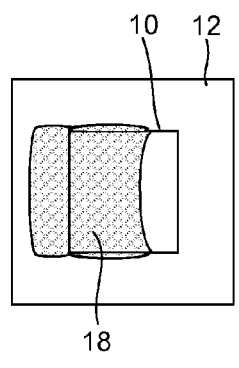 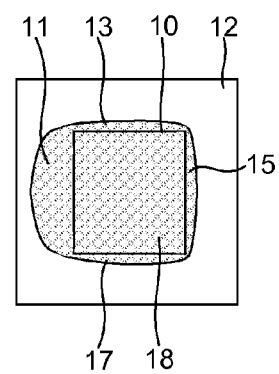
Fig. 2(A) (Prior Art)    Fig. 2(B) (Prior Art)    Fig. 2(C) (Prior Art)    Fig. 2(D) (Prior Art)
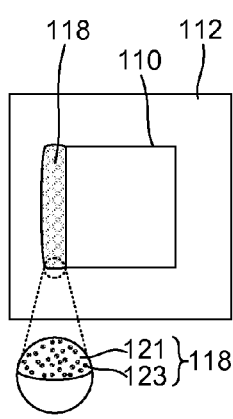 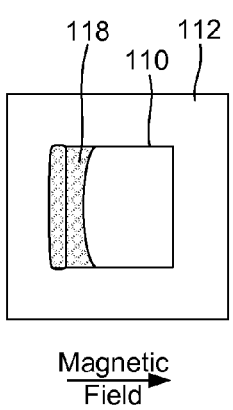 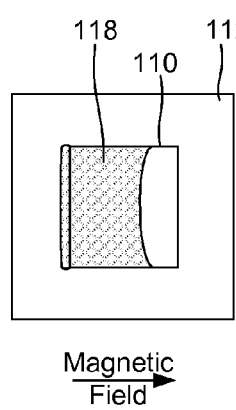 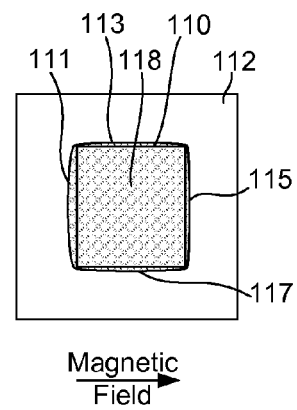
Fig. 3(A)    Fig. 3(B)    Fig. 3(C)    Fig. 3(D)

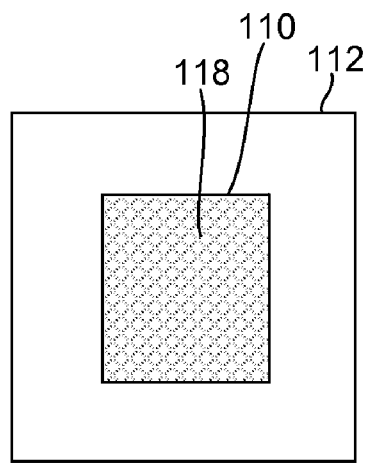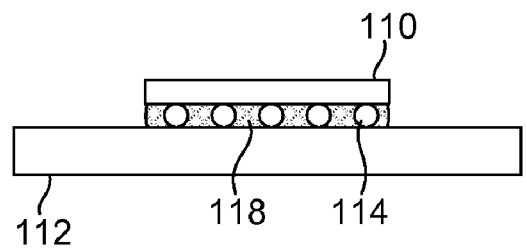
Fig. 4(A)    Fig. 4(B)
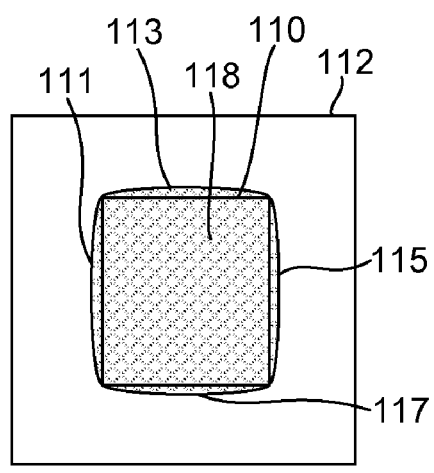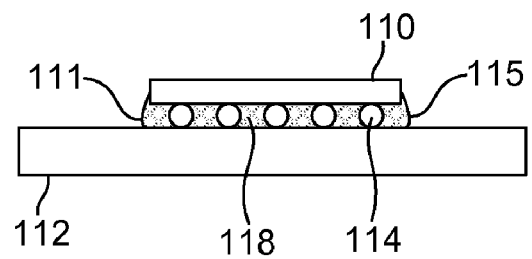
Fig. 5(A)    Fig. 5(B)

DIRECTING THE FLOW OF UNDERFILL MATERIALS USING MAGNETIC PARTICLES

RELATED ART

In certain conventional electronic assembly manufacturing procedures, a die 10 and a substrate 12 are brought into electrical contact through solder bumps 14. A reflow operation is carried out by heating to a temperature greater than the melting point of the solder, and a solder connection is made between the pads on the die 10 and pads on the substrate 12. A material such as a polymer is then typically applied between the chip and substrate as an underfill encapsulant.

As illustrated in FIG. 1, a dispenser 16 such as a needle is positioned adjacent to a die 10 coupled to a substrate 12 through solder bumps 14. An underfill material 18 is dispensed on the substrate 12 next to the die attach area (the area that is covered by the die 10). The underfill material 18 may include a polymer, for example, an epoxy. With the application of heat, the underfill material 18 may be made to flow between the die 10 and substrate 12, using capillary action. When formed from a polymer epoxy, the underfill material 18 may then be cured. The cured underfill material 18 surrounds the solder bumps 14 and protects the bumps and connection between the die 10 and substrate 12, as well as support the die 10 on the substrate 12.

FIGS. 2(A)-2(D) illustrate the flow of the underfill material 18 (cross-hatched in FIGS. 2(A)-2(D)) under the die 10. FIG. 2(A) shows underfill material 18 adjacent to the die 10. FIGS. 2(B)-2(D) show the progression of the underfill material 18 across the die attach area between the die 10 and substrate 12, due to capillary forces. FIG. 2(D) illustrates the final position of the underfill material 18, including the presence of a tongue region 11 and side spread regions 13, 15, 17 of underfill material 18 on the surface of the substrate 12, to the sides of the die 10. The tongue region 11 is larger than the side spread regions 13, 15, 17 because the tongue region 11 is on the side where the underfill material 18 was initially dispensed.

BRIEF DESCRIPTION OF THE DRAWINGS

Embodiments are described by way of example, with reference to the accompanying drawings, which are not drawn to scale, wherein:

FIGS. 2(A)-2(D) illustrate the flow of underfill material into the die attach region between a die and a substrate due to capillary action, in accordance with certain conventional processing procedures;

FIGS. 3(A)-3(D) illustrate the flow of underfill material into the die attach region between a die and a substrate when applying a magnetic field to an underfill material including magnetic particles, in accordance with certain embodiments;

FIGS. 4(A)-4(B) illustrate views of an assembly in which the application of a magnetic field to an underfill material results in no tongue region or side spread regions being formed, in accordance with certain embodiments;

FIG. 5(A)-5(B) illustrate views of an assembly in which the application of a magnetic field to an underfill material results in a small and uniform in size tongue region and side spread regions being formed, in accordance with certain embodiments;

DETAILED DESCRIPTION

Figure 1:
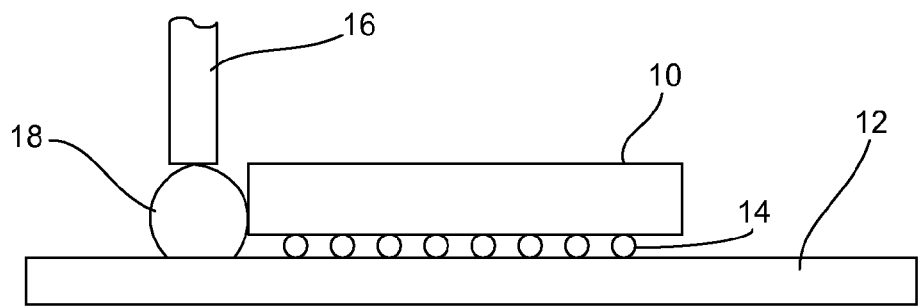
FIG. 1 illustrates a side view of a conventional processing operation in which an underfill material is dispensed on a substrate.

The presence of tongue and/or side spread regions as illustrated in FIG. 2(D) can lead to certain problems due to the large surface area that becomes covered with the underfill material. Such problems may include interactions between the underfill material and other structures, for example, when the substrate is small as in ultra small form factors, and when devices such as die side capacitors are mounted on the die side of the substrate. As a result, the underfill keep out zone on the substrate (the area where other structures are kept out due to the spread of the underfill material beyond the die attach area) may be undesirably large.

Certain embodiments relate to the formation of electronic assemblies, in which the flow of underfill material outside of the die attach area is inhibited. Certain embodiments include electronic assemblies. Certain embodiments include methods for forming electronic assemblies.

FIGS. 3(A)-3(D) illustrate views of an electronic assembly during several stages of processing, in accordance with certain embodiments. More specifically, FIGS. 3(A)-3(D) illustrate the flow of underfill material 118 (cross-hatched in FIGS. 3(A)-5(B)) into a die attach region between a die 110 and a substrate 112 when applying a magnetic field to the underfill material 118, as indicated by the arrow in FIGS. 3(B)-3(D). It should be appreciated that as illustrated in certain Figures herein, the underfill material 118 is observed through the die 110. Die materials are not typically formed from transparent materials. However, to clearly indicate the position of the underfill material 118, the die 110 appears to be transparent in certain Figures.

FIG. 3(A) shows the position of the underfill material 118 after it is dispensed on the substrate 112, adjacent to one side of the die 110. As illustrated in the blown-up portion of FIG. 3(A), the underfill material 118 includes particles 123 dispersed in an underfill matrix material 121. The particles 123 may be formed from a variety of magnetic materials, including, but not limited to aluminum, platinum, magnesium, molybdenum, lithium, tantalum, and iron containing materials. One example of suitable magnetic particles includes $Fe_2O_3$ particles. The magnetic particles may include a surface functionalization layer that is optimized to coat the particle with a layer that is electrically insulating in order to prevent the magnetic particles from causing the underfill material to become an electrically conductive medium. A specific example of suitable magnetic particles with a coating includes $Fe_2O_3$ nanoparticles with alkyl surface functionalization. Other size particles (larger than nanoparticles) may also be used in various embodiments. Additional additives (for example, to inhibit particle agglomeration) may also be included in the underfill material 118, if desired.

The underfill matrix material 121 of the underfill material 118 may be any suitable material including, but not limited to, polymer epoxies. Suitable underfill matrix materials 121 may also include fillers therein, such as silica ($SiO_2$) filler and the like, and other additives as desired. Certain embodiments may include an underfill material such as an epoxy, containing up to 70 weight percent of particles, with the particles including both magnetic particles and filler particles, or with the particles only including magnetic particles.

FIGS. 3(B)-3(C) illustrate the progression of the underfill material 118 across the die attach region between the die 110 and substrate 112, when subjected to a magnetic field in certain geometries, for example, in the direction of the arrow, and FIG. 3(D) showing the final position of the underfill material, including a substantially reduced tongue region 111 and smaller side spread regions 113, 115, 117, when compared with conventional underfill processes. The magnetic field induces movement of the magnetic particles. As the particles move, they drag the underfill matrix fluid with them. By controlling the position and intensity of the magnetic field, the placement of the underfill may be carefully controlled. Precise control of the size and location of the tongue region 111 and side spread regions 113, 115, 117 may be accomplished through the use of magnetic force from one or more magnetic fields positioned to attract the magnetic particles in one or more directions to control the flow of the underfill material. This may be accomplished using at least one of a static magnetic field, a non-uniform magnetic field, and multiple magnetic fields at various locations. In addition, in certain embodiments, application of the magnetic field enables the underfill material to be positioned substantially faster than when using conventional methods for positioning the underfill material.

FIGS. 4(A)-4(B) illustrate an embodiment in which the application of magnetic force using one or more magnetic fields is controlled so that there is no tongue region and no side spread regions of underfill material extending outward from the die attach region. FIG. 4(A) illustrates a top view a die 110 coupled to a substrate 112 through a plurality of bump bonds 114, with underfill material 118 positioned between the die 110 and substrate 112. As seen in both the top view of FIG. 4(A), and the side view of FIG. 4(B), there is no underfill material 118 extending on the substrate 112 to the sides of the die 110. FIGS. 5(A)-5(B) also illustrate top and side views of the die 110 coupled to the substrate 112 through bump bonds 114, however, in this embodiment, the application of a magnetic field is controlled so that the underfill material, including the tongue 111 and side spread regions 113, 115, 117, are substantially the same size.

It should be appreciated that the magnetic field position may be controlled so that a desired amount of tongue and sidespread regions can be formed. For example, in certain applications, it may be useful to control the spread of the underfill material to a small, uniform distance outward from the die attach area, for protection. In one such example, the underfill material extends outward on the substrate from the die attach area a distance of no greater than 1 mm. In other applications it may be useful to further minimize or have no underfill spread on the substrate beyond the die attach area, or to provide for different amounts of underfill spread on different sides of the die attach area.

Figure 6:
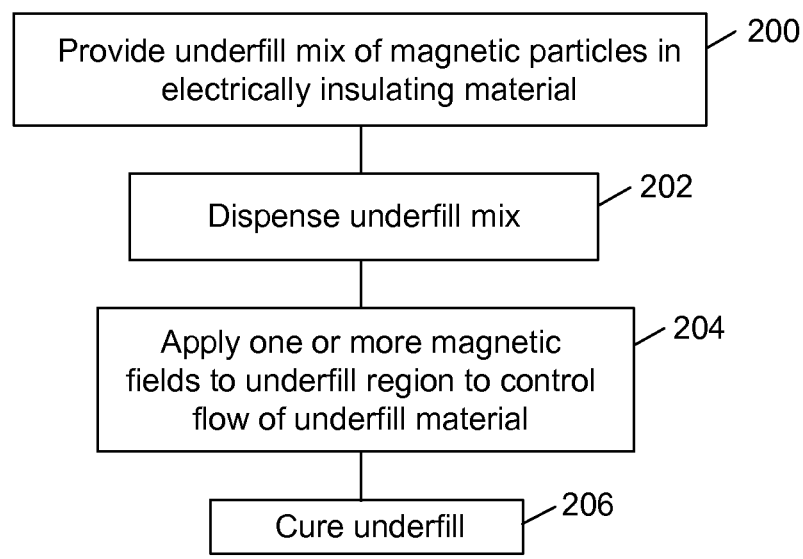
FIG. 6 illustrates a flow chart of operations in a process for forming an assembly using an underfill material including magnetic particles and applying a magnetic field to the underfill material, in accordance with certain embodiments.

FIG. 6 is a flow chart showing a number of operations in accordance with certain embodiments. Box 200 is providing an underfill mixture including magnetic particles in an electrically insulating material such as a polymer epoxy. The magnetic particles may include a surface coating thereon, to inhibit electrical shorting through the underfill mixture. Box 202 is dispensing the underfill mixture onto a substrate adjacent to the gap between a first body such as a die and a second body such as a package substrate. Box 204 is applying a magnetic force using one or more magnetic fields to control the flow of the underfill material in and through the gap between the die and substrate. The one or more magnetic fields may also be utilized to control the extent to which some of the underfill material flows outside of the gap between the die and the substrate, for example, to minimize the size of the tongue region and the side spread regions. Where a material such as a polymer epoxy is used as the underfill material, Box 206 is curing the polymer epoxy. Various modifications to the above operations may be made, with certain operations being optional.

Figure 7:
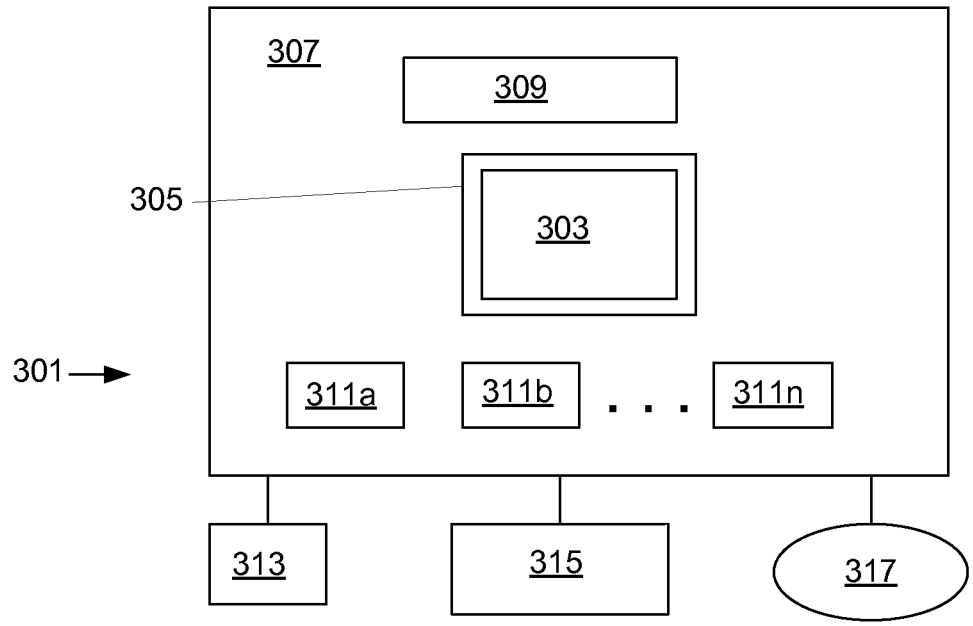
FIG. 7 illustrates an electronic system arrangement in which embodiments may find application.

Assemblies including a substrate and die joined together as described in embodiment above may find application in a variety of electronic components. FIG. 7 schematically illustrates one example of an electronic system environment in which aspects of described embodiments may be embodied. Other embodiments need not include all of the features specified in FIG. 7, and may include alternative features not specified in FIG. 7.

The system 301 of FIG. 7 may include at least one central processing unit (CPU) 303. The CPU 303, also referred to as a microprocessor, may be a die which is attached to an integrated circuit package substrate 305, which is then coupled to a printed circuit board 307, which in this embodiment, may be a motherboard. The CPU 303 on the package substrate 305 is an example of an electronic device assembly that may be formed in accordance with embodiments such as described above. A variety of other system components, including, but not limited to memory and other components discussed below, may also include die and substrate structures formed in accordance with the embodiments described above.

The system 301 may further include memory 309 and one or more controllers 311a, 311b . . . 311n, which are also disposed on the motherboard 307. Such controllers 311a, 311b . . . 311n may include, but are not limited to, video controllers, audio controllers, memory controllers, and the like. The motherboard 307 may be a single layer or multi-layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in individual sockets or may be connected directly to a printed circuit board. A display 315 may also be included.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The system 301 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 311a, 311b . . . 311n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
   providing a semiconductor die and a substrate;
   coupling the semiconductor die to the substrate, wherein a gap remains between the semiconductor die and the substrate, wherein an open region extends laterally outward on the substrate on four sides of the gap, wherein the open region is not covered by the semiconductor die;
   placing an underfill material on the substrate, the underfill material comprising a polymer material and magnetic particles;
   positioning at least part of the underfill material in the gap;
   controlling the positioning of the underfill material using magnetic force, wherein the controlling the positioning includes controlling the flow of the underfill material so that the flow of the underfill material in the open region on the substrate is controlled by the magnetic force;
   wherein the flow of the underfill material into the open region is controlled so that the underfill material extends into the open region on the four sides of the gap on the substrate, wherein the underfill material extends no greater than 1 mm into the open region on the substrate on each of the four sides; and
   solidifying the polymeric material.

2. The method of claim 1, wherein the magnetic particles include an electrically insulating layer thereon.

3. The method of claim 1, wherein the magnetic particles include a alkyl surface layer thereon.

4. The method of claim 1, wherein the underfill material further comprises silica particles.

5. The method of claim 1, wherein the controlling the positioning of the underfill material using magnetic force comprises applying a non-uniform magnetic field to the underfill material.

6. A method comprising:
   providing a first body and a second body;
   coupling the first body to the second body, wherein a gap remains between the first body and the second body, wherein an open region extends laterally outward on the second body on four sides of the gap, the open region not covered by the first body;
   placing an underfill material on the second body;
   delivering a flow of at least part of the underfill material into the gap; and
   controlling the flow of the underfill material using magnetic force, wherein the controlling the flow includes controlling the flow of the underfill material so that the underfill material extends into the open region on the four sides of the gap on the second body, wherein the underfill material extends no greater than 1 mm into the open region on the second body on each of the four sides.

7. The method of claim 6, wherein the placing the underfill material on the second body comprises depositing a material comprising a polymer and magnetic particles adjacent to the gap, and wherein the controlling the flow of the underfill material using magnetic force comprises applying a magnetic field in at least one direction that causes the underfill material to be drawn into the gap.

8. The method of claim 6, wherein the placing the underfill material on the second body includes placing a material comprising a polymer epoxy and magnetic particles on the second body.

9. The method of claim 6, further comprising curing the polymer epoxy.

10. The method of claim 6, wherein the placing the underfill material on the second body includes placing a material comprising a polymer epoxy, magnetic particles, and silica particles on the second body.

11. The method of claim 6, wherein the controlling the flow of the underfill material using magnetic force comprises applying a static magnetic field to the underfill material.

12. The method of claim 6, wherein the controlling the flow of the underfill material using magnetic force comprises applying a non-uniform magnetic field to the underfill material.

13. The method of claim 6, wherein the controlling the flow of the underfill material using magnetic force comprises using an electromagnet to generate the magnetic force.

14. The method of claim 6, wherein the coupling the first body to the second body including coupling the first body to the second body through a plurality of electrically conductive bumps positioned between the first body and the second body.

15. The method of claim 6, wherein the first body is a semiconductor die and the second body is a substrate.

* * * * *